United States Patent
Clevenger et al.

(10) Patent No.: US 7,101,784 B2
(45) Date of Patent: Sep. 5, 2006

(54) METHOD TO GENERATE POROUS ORGANIC DIELECTRIC

(75) Inventors: Lawrence A. Clevenger, LaGrangeville, NY (US); Stephen E. Greco, LaGrangeville, NY (US); Keith T. Kwietniak, Highland Falls, NY (US); Soon-Cheon Seo, White Plains, NY (US); Chih-Chao Yang, Beacon, NY (US); Yun-Yu Wang, Poughquag, NY (US); Kwong H. Wong, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/125,549

(22) Filed: May 10, 2005

(65) Prior Publication Data

US 2005/0200024 A1    Sep. 15, 2005

Related U.S. Application Data

(62) Division of application No. 10/249,799, filed on May 8, 2003, now Pat. No. 6,921,978.

(51) Int. Cl.
    *H01L 21/4763* (2006.01)
(52) U.S. Cl. ........................ 438/623; 438/625; 438/637
(58) Field of Classification Search ........ 438/622–629, 438/637–640, 672, 675, 778, 780–781, 798
    See application file for complete search history.

(56) References Cited

U.S. PATENT DOCUMENTS

| | | | |
|---|---|---|---|
| 5,472,913 A | 12/1995 | Havemann et al. | |
| 6,159,842 A | 12/2000 | Chang et al. | |
| 6,171,945 B1 | 1/2001 | Mandal et al. | |
| 6,214,423 B1 | 4/2001 | Lee et al. | |
| 6,277,765 B1 | 8/2001 | Cheng et al. | |
| 6,323,121 B1 | 11/2001 | Liu et al. | |
| 6,342,454 B1 | 1/2002 | Hawker et al. | |
| 6,355,563 B1 | 3/2002 | Cha et al. | |
| 6,383,950 B1 | 5/2002 | Pangrle et al. | |
| 6,399,666 B1 | 6/2002 | Hawker et al. | |
| 6,420,441 B1 | 7/2002 | Allen et al. | |
| 6,451,712 B1 | 9/2002 | Dalton et al. | |
| 6,596,467 B1 | 7/2003 | Gallagher et al. | |

(Continued)

*Primary Examiner*—Thanhha Pham
(74) *Attorney, Agent, or Firm*—Gibb I.P. Law Firm, LLC; Ira D. Blecker, Esq.

(57) ABSTRACT

The invention provides a method of forming a wiring layer in an integrated circuit structure that forms an organic insulator, patterns the insulator, deposits a liner on the insulator, and exposes the structure to a plasma to form pores in the insulator in regions next to the liner. The liner is formed thin enough to allow the plasma to pass through the liner and form the pores in the insulator. During the plasma processing, the plasma passes through the liner without affecting the liner. After the plasma processing, additional liner material may be deposited. After this, a conductor is deposited and excess of portions of the conductor are removed from the structure such that the conductor only remains within patterned portions of the insulator. This method produces an integrated circuit structure that has an organic insulator having patterned features, a liner lining the patterned features, and a conductor filling the patterned features. The insulator includes pores along surface areas of the insulator that are in contact with the liner and the pores exist only along the surface areas that are in contact with the liner (the liner is not within the pores).

20 Claims, 4 Drawing Sheets

U.S. PATENT DOCUMENTS

2001/0034137 A1 10/2001 Nambu
2002/0001952 A1 1/2002 Chooi et al.
2002/0074659 A1 6/2002 Dalton et al.
2004/0026783 A1 2/2004 Kloster et al.
2004/0096672 A1* 5/2004 Lukas et al. ................ 428/446

* cited by examiner

METHOD TO GENERATE POROUS ORGANIC DIELECTRIC

Cross-Reference To Related Applications

This Application is a division of U.S. patent application Ser. No. 10/249,799, filed May 8, 2003. Now U.S. Pat. No. 6,921,978.

BACKGROUND OF INVENTION

The present invention generally relates to integrated circuit structures and more particularly to a structure and process that reduces capacitance of organic insulators by forming pores between the insulators and the liner that lines conductive features.

Recent technological advances in integrated circuit design include the use of insulators (dielectrics) that have a lower dielectric constant (and are softer) which are replacing older, harder, higher dielectric constant insulators. Lower dielectric constant materials generally include organic low K dielectrics commercial products, such as SiLK, available from Dow Chemical Company, NY, USA. These lower dielectric constant insulators are referred to as "low-k" dielectrics. These low-k dielectrics are advantageous because they decrease overall capacitance, which increases device speed and allows lower voltages to be utilized (making the device smaller and less expensive). Such low-k dielectrics have substantial and well-documented advantages over previous high-K dielectrics.

Additional progress has been made with low-k dielectrics by utilizing the porous form of such dielectrics because the porous forms of such dielectrics have reduced capacitance. However, a problem exists when using porous low-k dielectrics because the material used to line trenches and vias often fills the pores along the sidewalls of the trenches and vias. This reduces the effectiveness of the porous dielectric and can also result in defects if enough liner material escapes into the porous material. The invention described below overcomes these problems through a new structure and methodology.

SUMMARY OF INVENTION

The invention provides a method of forming a wiring layer in an integrated circuit structure that forms an organic insulator, patterns the insulator, deposits a liner on the insulator, and exposes the structure to a plasma to form pores in the insulator in regions next to the liner. The thickness of the liner is limited (e.g., 10–500 Angstroms) so as to allow the plasma to pass through the liner and form the pores in the insulator. During the plasma processing, the plasma passes through the liner without affecting the liner. After the plasma processing, additional liner material may be deposited. After this, a conductor is deposited and excess portions of the conductor are removed from the structure such that the conductor only remains within patterned portions of the insulator.

This method produces an integrated circuit structure that has an organic insulator having patterned features, a liner lining the patterned features, and a conductor filling the patterned features. The insulator includes pores along surface areas of the insulator that are in contact with the liner and the pores exist only along the surface areas of the insulator that are in contact with the liner (the liner is not within the pores).

The organic insulator comprises SiLK, poly (alyene) ethers, fluoro-polyimides, bis-benzocyclobutenes, hydrido-organo-siloxane polymers, etc., and the insulator includes increased hydrogen, nitrogen, etc., concentrations along the pores from the plasma processing. The liner has a first layer that is thin enough to allow plasma to pass through the liner and a second layer over the first layer (e.g., the layers have a thickness of 10–500 Angstroms).

The application of the plasma does not change the liner, but instead only affects the area of the low-k dielectric that is directly adjacent to the liner. Therefore, the invention does not allow any of the liner material to enter the pores of the dielectric. This allows the dielectric to retain its lower capacitance characteristics and also avoids defects that can occur if the liner material enters the porous portion of the dielectric.

Further, the inventive process only forms pores in the regions directly adjacent to the liner. This allows the remainder of the low-k dielectric to remain in a non-porous condition, which reduces the number of defects that are associated with making the entire low-k dielectric layer porous. In addition, by forming pores next to the liners, the structure can accommodate the different thermal expansion rates between the adjacent conductive structures and the low-k dielectric structure.

BRIEF DESCRIPTION OF DRAWINGS

The invention will be better understood from the following detailed description of preferred embodiments of the invention with reference to the drawings, in which.

DETAILED DESCRIPTION

As mentioned above, one problem with using porous low-k dielectrics (especially organic low-k dielectrics) occurs at the boundary between the liner and the porous low-k dielectric. More specifically, portions of the liner can fill the pores or diffuse into the low-k dielectric through the pores, thereby reducing the effectiveness of the dielectric or potentially resulting in a breach of the sidewall and/or inconsistency of the liner, resulting in defects. Such problems make it difficult to seal the porous low-k organic dielectric with the liner.

The invention overcomes these problems by utilizing a thin liner (e.g., 10–500 Angstroms) on non-porous low-k dielectrics. The invention applies a pure gas or a mix of $H_2$, Ar, He, Ne, Xe, $N_2$, $NH_3$, or $N_2H_2$ plasma treatment (densification) after the thin liner it is formed. Further liner materials may be subsequently formed on the thin liner after the plasma treatment. The gas plasma passes through the grain boundary of liner and forms pores within the low-k organic dielectric. The application of the plasma does not change the liner, but instead only affects the area of the low-k dielectric that is directly adjacent to the liner. Therefore, the invention does not allow any of the liner material to enter the pores of the dielectric. This allows the dielectric to retain its lower capacitance characteristics and also avoids defects that can occur if the liner material enters the porous portion of the dielectric.

Further, the inventive process only forms pores in the regions directly adjacent to the liner. This allows the remainder of the low-k dielectric to remain in a non-porous condition, which reduces the number of defects that are associated with making the entire low-k dielectric layer porous. Such defects occur when an increase in the concentration of pores forms undesirable voids in the low-k dielectric. In addition, by forming pores next to the liners, the structure can accommodate the different thermal expansion rates between the adjacent conductive structures and the low-k dielectric structure. Alternatively, if the process begins with a porous dielectric, the gas plasma merely forms pores in the region adjacent the liner.

Figure 1:
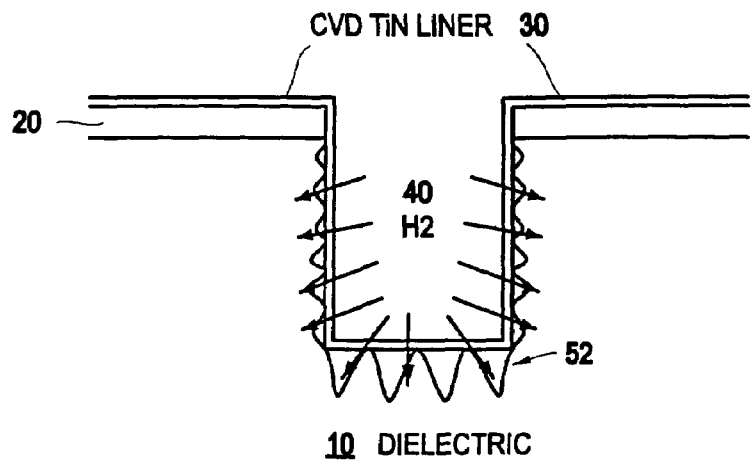
FIG. 1 is a schematic diagram of the structure produced with the invention.
Figure 2:
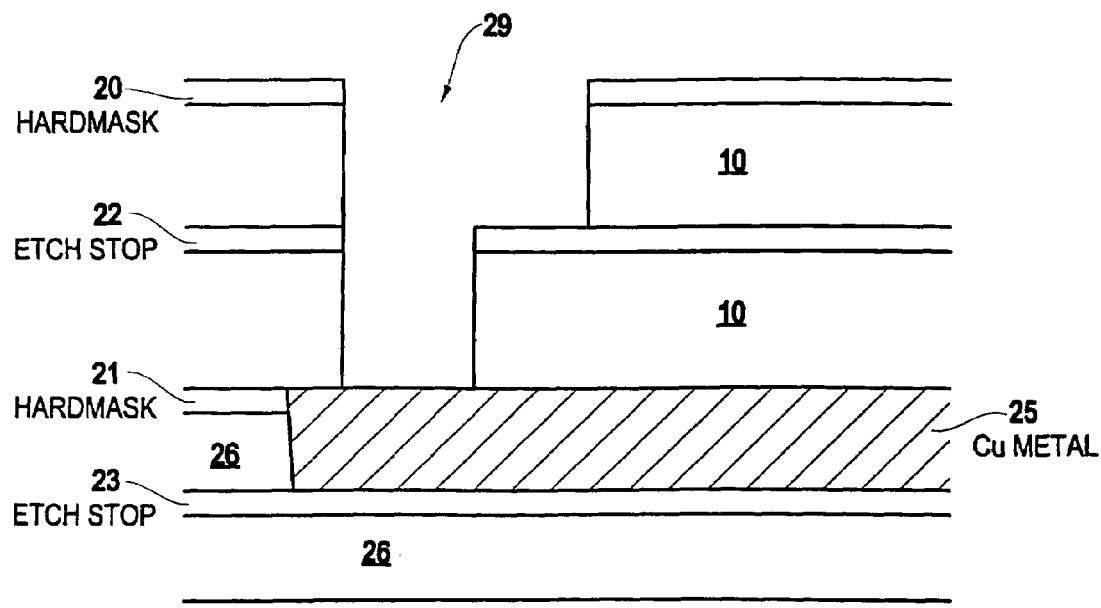
FIG. 2 is a schematic diagram of partially completed structure according to the invention.

One example of the invention is shown in FIG. 1. Item 10 represents the low-k organic dielectric over which a hard mask 20 has been formed. An initial thin (10–500 Angstroms) liner 30 which includes any one or more selected from the group comprising Ta, TaN, Ti, Ti(Si)N or W has been conformably formed on the patterned wafer. Item 40 represents the exposure of the structure to the plasma $H_2$, Ar, He, Ne, Xe, $N_2$, $NH_3$, or $N_2H_2$. As described above, the plasma 40 passes through the grain boundaries of the liner 30 without affecting the liner 30; however, the plasma 40 create pores 52 in the regions of the dielectric 10 that border the liner 30. Once again, the invention reduces the capacitance of the dielectric without incurring the penalties that conventional structures encounter when using porous dielectrics.

Figure 3:
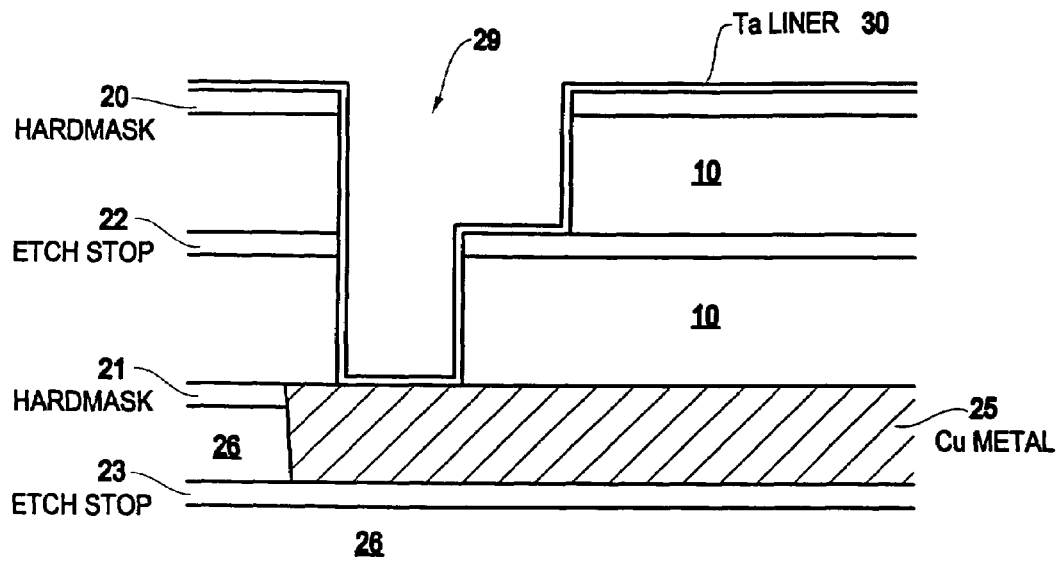
FIG. 3 is a schematic diagram illustrating the inventive thin liner.
Figure 4:
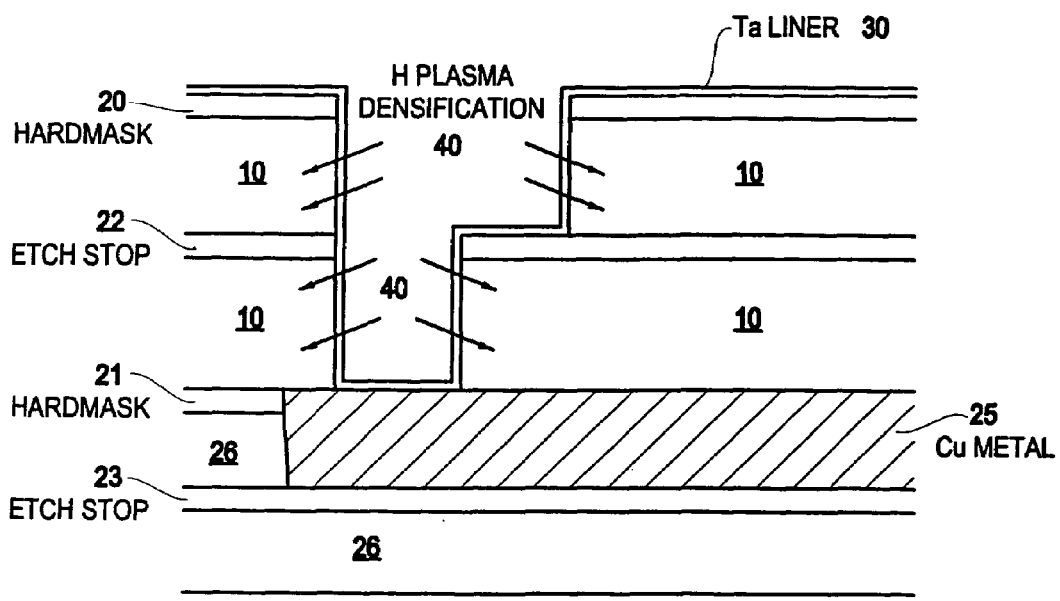
FIG. 4 is a schematic diagram illustrating plasma densification.

In FIG. 3, the liner 30 is deposited over the structure using any conventional deposition technique (e.g, CVD, PVD, etc.) that will provide uniform coverage of the liner 30 throughout the opening 29. In FIG. 4, the structure is exposed to the plasma gas 40 which, as discussed above, forms pores 52 in the areas of the low-k dielectric 10 that are adjacent to the liner 30, without affecting the liner 30 (as shown FIG. 5).

Figure 5:
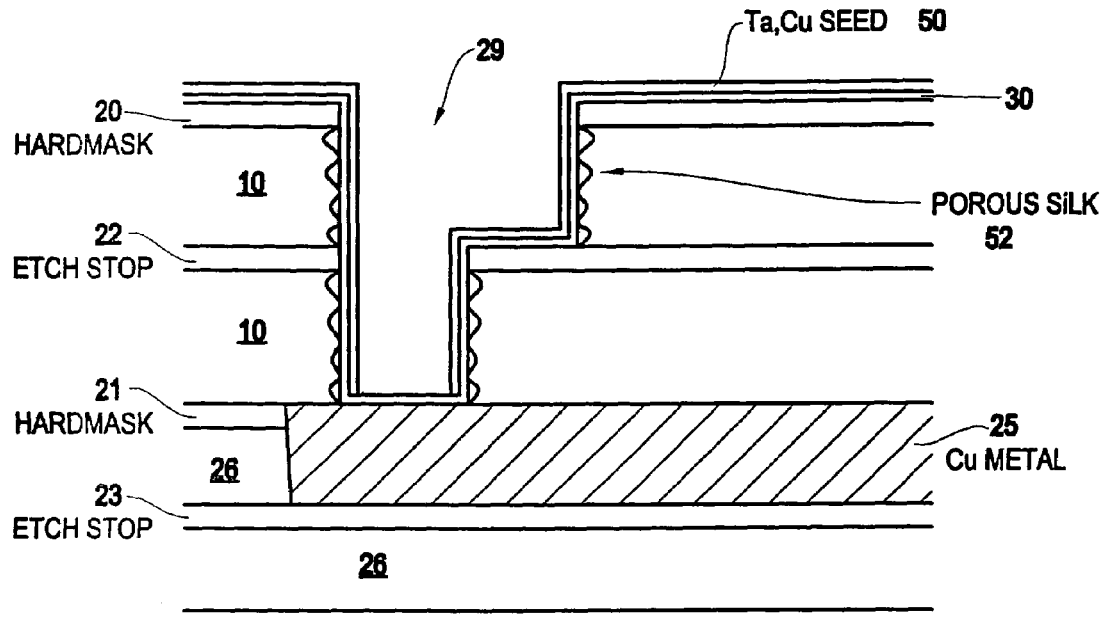
FIG. 5 is a schematic diagram illustrating additional liner and Cu seed deposition.

FIG. 5 also illustrates the subsequent formation of additional liner material along with seed material 50 (the liner/seed material having a thickness of 10–500 angstroms and comprising one or more of TaN, Ta, Ti, Ti(Si)N, W, and Cu) that will be used in subsequent processes that form conductors within the opening 29. Therefore, the inventive structure actually includes a liner as that has two parts. The first part of the liner 30 is used during the plasma treatment. The second part of the liner 50 can include some seed material for the conductor 61 that will subsequently fill the opening 29.

Figure 6:
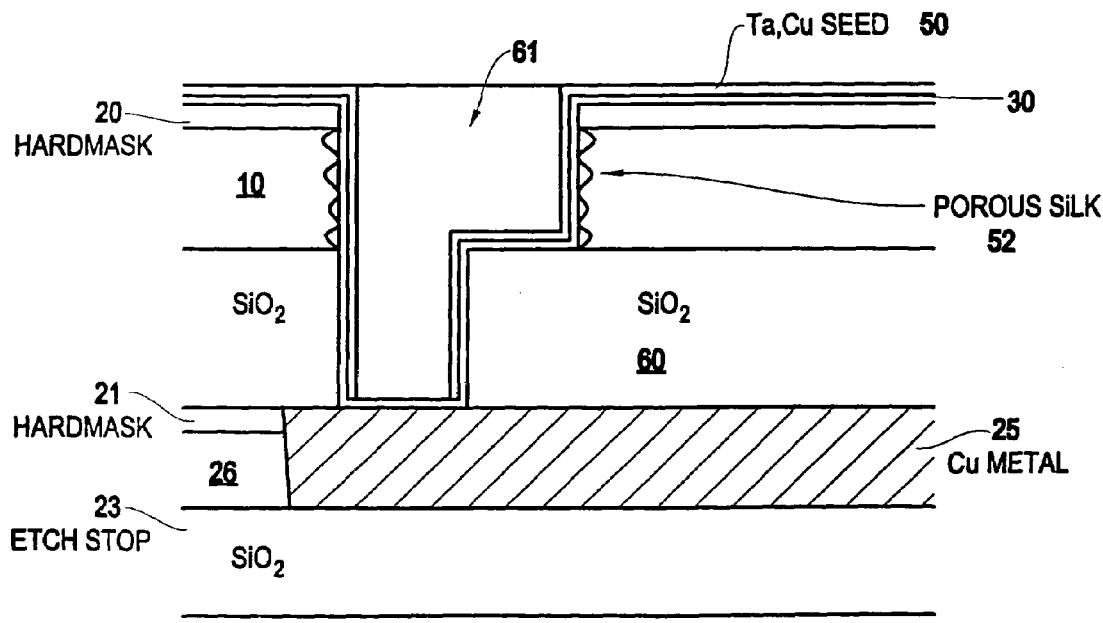
FIG. 6 is a schematic diagram of a dual damascene structure.
Figure 7:
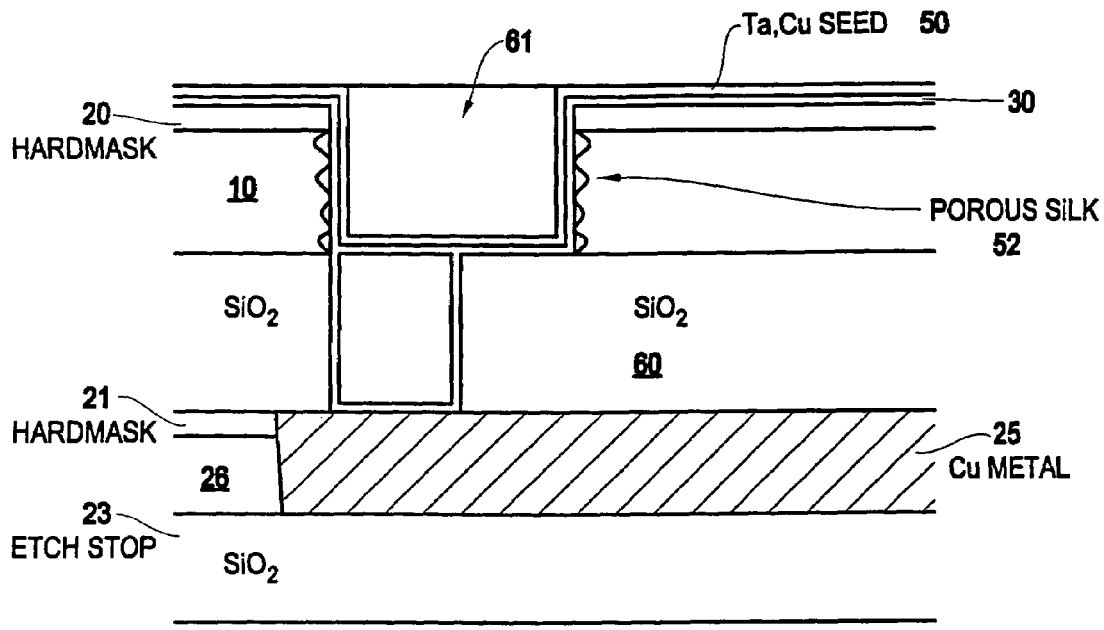
FIG. 7 is a schematic diagram of a single damascene structure.

FIGS. 6 and 7 illustrate similar structures to that shown in FIG. 5 with minor changes regarding different insulator materials 60 ($SiO_2$, SiCOH, etc.) and the elimination of one of the etch stops 22. FIG. 6 illustrates a structure that undergoes a dual-damascene process to fill the opening 29 with a conductor 61, while FIG. 7 illustrates a structure that will undergo a single damascene process. Otherwise, the structures shown in FIGS. 6 and 7 are similar to, and will undergo a similar process to that described above with respect to the structure in FIG. 5.

Figure 8:
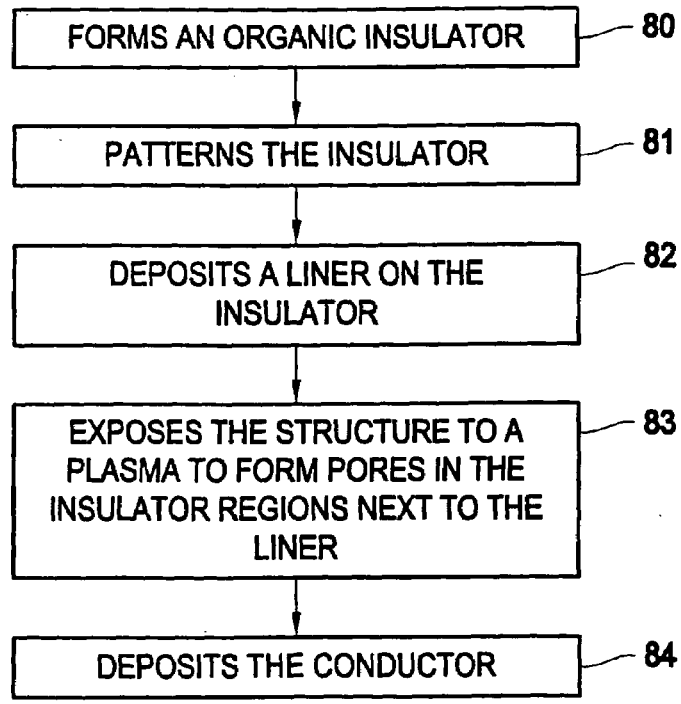
FIG. 8 is a flow diagram illustrating a preferred method of the invention.

The processing of the invention is shown in flowchart form in FIG. 8. More specifically, the invention forms an organic insulator 80, patterns the insulator 81, deposits a liner on the insulator 82, and exposes the structure to a plasma to form pores in the insulator in regions next to the liner 83. The liner is formed sufficiently thin (e.g., the thickness is limited) so as to allow the plasma to pass through the liner and form the pores in the insulator. During the plasma processing, the plasma passes through the liner without affecting the liner. After the plasma processing, additional liner material may be deposited. After this, a conductor is deposited and excess of portions of the conductor are removed from the structure such that the conductor only remains within patterned portions of the insulator 84.

The application of the plasma does not change the liner, but instead only affects the area of the low-k dielectric that is directly adjacent to the liner. Therefore, the invention does not allow any of the liner material to enter the pores of the dielectric. This allows the dielectric to retain its lower capacitance characteristics and also avoids defects that can occur if the liner material enters the porous portion of the dielectric.

Further; the inventive process only forms pores in the regions directly adjacent to the liner. This allows the remainder of the low-k dielectric to remain in a non-porous condition, which reduces the number of defects that are associated with making the entire low-k dielectric layer porous. In addition, by forming pores next to the liners, the structure can accommodate the different thermal expansion rates between the adjacent conductive structures and the low-k dielectric structure.

While the invention has been described in terms of preferred embodiments, those skilled in the art will recognize that the invention can be practiced with modification within the spirit and scope of the appended claims.

The invention claimed is:

1. A method of forming a wiring layer in an integrated circuit structure, said method comprising:
   forming an organic insulator;
   patterning said organic insulator to form patterned features in said organic insulator;
   depositing a liner on said organic insulator; and
   exposing said organic insulator and said liner to a plasma to form pores in said organic insulator beneath said liner, wherein said pores are formed only along and directly contacting sides of said patterned features defined by interfaces between said organic insulator and said liner, said pores reducing capacitance of said organic insulator.

2. The method in claim 1, wherein said depositing of said liner forms said liner to a thickness sufficient to allow said plasma to pass through said liner and form said pores in said organic insulator.

3. The method in claim 1, wherein said depositing of said liner forms said liner to have a thickness of 10–500 Angstroms.

4. The method in claim 1, wherein, during said exposing process, said plasma passes through said liner without affecting said liner.

5. The method in claim 1, wherein said pores exist only along areas of said organic insulator that are in contact with said liner.

6. The method in claim 1, wherein said liner is not within said pores.

7. The method in claim 1 wherein said organic insulator comprises one of poly (alyene) ethers, fluoro-polyimides, bis-benzocyclobutenes, and hydrido-organo-siloxane polymers.

8. The method in claim 1, wherein said organic insulator includes increased concentrations of one of hydrogen, argon, helium, xenon, and nitrogen along said pores.

9. The method in claim 1, wherein said liner comprises a first layer having a thickness sufficient to allow a plasma to pass through said liner.

10. A method of forming a wiring layer in an integrated circuit structure, said method comprising:

forming an organic insulator;

patterning said organic insulator to form patterned features in said organic insulator;

depositing a liner on said organic insulator; and exposing said organic insulator and said liner to a plasma to form pores in said organic insulator beneath said liner, wherein said pores are formed only along and directly contacting sides of said patterned features defined by interfaces between said organic insulator and said liner, said pores reducing capacitance of said organic insulator, and wherein said depositing of said liner forms said liner to a thickness sufficient to allow said plasma to pass through said liner and form said pores in said organic insulator.

11. The method in claim 10, wherein said depositing of said liner forms said liner to have a thickness of 10–500 Angstroms.

12. The method in claim 10, wherein, during said exposing process, said plasma passes through said liner without affecting said liner.

13. The method in claim 10, wherein said pores exist only along areas of said organic insulator that are in contact with said liner.

14. The method in claim 10, wherein said liner is not within said pores.

15. The method in claim 10, wherein said organic insulator comprises one of poly (alyene) ethers, fluoro-polyimides, bis-benzocyclobutenes, and hydrido-organo-siloxane polymers.

16. The method in claim 10, wherein said organic insulator includes increased concentrations of one of hydrogen, argon, helium, xenon, and nitrogen along said pores.

17. The method in claim 10, wherein said liner comprises a first layer having a thickness sufficient to allow a plasma to pass through said liner.

18. A method of forming a wiring layer in an integrated circuit structure, said method comprising:

forming an organic insulator;

patterning said organic insulator to form patterned features in said organic insulator;

depositing a liner on said organic insulator; and exposing said organic insulator and said liner to a plasma to form pores in said organic insulator beneath said liner, wherein said pores exist only along areas of said organic insulator that are in contact with said liner, and wherein said pores are formed only along and directly contacting sides of said patterned features defined by interfaces between said organic insulator and said liner, said pores reducing capacitance of said organic insulator.

19. The method in claim 18, wherein said liner is not within said pores.

20. The method in claim 18, wherein said liner comprises a first layer having a thickness sufficient to allow a plasma to pass through said liner.

* * * * *